United States Patent [19]

Giniewicz et al.

[11] Patent Number: 4,624,796
[45] Date of Patent: Nov. 25, 1986

[54] PIEZOELECTRIC FILLER AND FLEXIBLE PIEZOELECTRIC COMPOSITES

[75] Inventors: Jayne R. Giniewicz; Ahmad Safari; Robert E. Newnham; Leslie E. Cross, all of State College, Pa.

[73] Assignee: Celanese Corporation, New York, N.Y.

[21] Appl. No.: 804,574

[22] Filed: Dec. 4, 1985

Related U.S. Application Data

[63] Continuation-in-part of Ser. No. 742,333, Jun. 7, 1985.

[51] Int. Cl.$^4$ .................... C04B 35/00; C04B 35/02; C04B 35/46
[52] U.S. Cl. .................... 252/62.9; 501/134; 501/126
[58] Field of Search ............. 252/62.9; 501/38, 134, 501/126

[56] References Cited

U.S. PATENT DOCUMENTS 4,128,489 12/1978 Seo ...................... 252/62.9

FOREIGN PATENT DOCUMENTS 2922260 6/1979 Fed. Rep. of Germany .

OTHER PUBLICATIONS

Giniewicz et al, "PbTiO$_3$-BiFeO$_3$ as a Piezoelectric Composite Material," American Ceramic Society Bulletin, 86 Annual Meeting and Exposition, (32E-84), (May 9, 1984), p. 481.

Yagnik et al, "Mössbauer Effect in the Ferroelectric PbTiO$_3$-FeO$_3$ Solid Solutions," Journal of Applied Physics, vol. 40, No. 12, (Nov. 1969), pp. 4713–4715.

Primary Examiner—Andrew H. Metz
Assistant Examiner—Chung K. Pak
Attorney, Agent, or Firm—Depaoli & O'Brien

[57] ABSTRACT

A piezoelectric ceramic powder comprises a solid solution of PbTiO$_3$ and BiFeO$_3$ wherein a portion of the iron content is replaced with manganese. A piezoelectric ceramic-polymer composite of 0-3 connectivity is disclosed using as the piezoelectric filler the manganese-doped solid solution.

12 Claims, No Drawings

PIEZOELECTRIC FILLER AND FLEXIBLE PIEZOELECTRIC COMPOSITES

CROSS REFERENCE TO RELATED APPLICATION

This application is a continuation-in-part of copending U.S. patent application Ser. No. 742,333, filed June 7, 1985, entitled "PIEZOELECTRIC-POLYMER COMPOSITES WITH 0-3 CONNECTIVITY FOR TRANSDUCER APPLICATIONS".

BACKGROUND OF THE INVENTION

This invention concerns piezoelectric materials and, more specifically, an improved piezoelectric composite material that comprises a piezoelectric ceramic powder dispersed in a polymer matrix.

A variety of electro-mechanical transducers such as hydrophones, air sensors, vibration sensors, pressure and stress sensors depend on the piezoelectric phenomenon exhibited by certain piezoelectric crystals, polarized ceramics, and polarized polymers and composites. An important class of prior art sensors have as their active sensing element solid shapes of piezoelectric ceramic materials. In the particularly important hydrophone application area, the piezoelectrically active ceramic component converts underwater sound pressure waves to electrical signals which are then amplified and displayed. In recent years large numbers of sensors have come to be used in wide aperture arrays of individual sensors.

The solid shapes of the active sensing elements are fabricated from piezoelectric ceramic powders by a variety of standard consolidation techniques. Electrodes are bonded to two opposing faces in order to polarize the piezoelectric material during fabrication and to sense the electrical signals that develop in the material during use. Lead zirconate titanate compositions which are collectively referred to as PZT materials, are widely used because transducers based on these materials exhibit moderate sensitivity and durability. Solid shapes in the form of cubes, plates, tubes, and arrays thereof are commonly employed.

The detecting sensitivity of such prior art dense solid piezoelectric ceramics (piezo-ceramic) sensors, however is modest. The sensitivity of a sound receiver material is characterized by a hydrophone Figure-Of-Merit (FOM) which is commonly defined as the product of two hydrostatic piezoelectric coefficients, i.e. a charge coefficient, $d_h$, and a voltage coefficient, $g_h$. For conventional PZT-based piezo-ceramics, typical values for $d_h$ are in the range of about $50$–$60 \times 10^{-12}$ Coulombs/Newton (C/N) and values for $g_h$ are in the range of about $2$–$3 \times 10^{-3}$ volt×meter/Newton (Vm/N). The product of these is an FOM with values in the range of $100$–$200 \times 10^{-15}$ m²/Newton (m²/N). More sensitive hydrophone devices would result if piezoelectric materials with higher values of the $d_h$ and/or the $g_h$ coefficient were provided.

The hydrostatic charge coefficient $d_h$ is defined as the sum of the longitudinal charge coefficient $d_{33}$ and two transverse charge coefficients $d_{31}$ and $d_{32}$. In the lead titanate (PT) and PZT families of piezoelectric materials the sum of the transverse coefficients ($d_{31}+d_{32}$) is typically as large as the longitudinal coefficient and opposite in sign. Therefore $d_h$ in these materials is much smaller than $d_{33}$. The present invention concerns piezoelectric composite materials that exhibit $d_h$ coefficients that more closely approach the $d_{33}$ coefficient of the piezoelectric phase since the contributions of $d_{31}$ and $d_{32}$ are minimized.

Besides the use of solid shapes of piezoelectric ceramics, several types of piezoelectric composite materials have been investigated in which piezo-ceramics are combined with a polymer phase. The composites differ in the 'connectivity' of the piezoelectric and polymer phases. It has been found that the piezoelectric properties of the composites depend strongly on the manner in which the individual piezoelectric and polymer phases of diphasic composites are interconnected. Each phase in a composite can be self-connected in zero, one, two, or three dimensions between parallel exterior surfaces. According to convention the 'connectivity' of a two phase composite is given by two digits which refer, respectively, to the self-connectedness of the piezoelectric and polymer phases contained. For example, a composite comprised of piezoelectric powder dispersed in polymer is designated as having 0-3 connectivity. Diphasic composites can be fabricated in ten different connectivities. The 0-3 connectivity pattern is especially useful because it is a simple, effective material that can be fabricated in a variety of shapes including large area sheet and long cable forms.

The conventional piezoelectric materials of prior art dense ceramic sensors are compositions that have been optimized to have not only piezoelectric sensitivity but also strength and shock resistance in bulk forms. Lead zirconate titanate (PZT) compositions are most widely used. In order to provide piezoelectric ceramics that would have strength and shock resistance some compromises were made in piezoelectric sensitivity; that is, materials with adequate but modest piezoelectric coefficients came to be used.

Since 0-3 composites employ piezoelectric materials in powder form the requirement for strength and shock resistance in bulk ceramic forms no longer applies and new piezoelectric compositions with maximum piezoelectric sensitivities in composites are coming into use. The best of these new materials that has been previously described is the family of solid solutions of lead titanate (PT) and bismuth ferrite (BF) (referred to below as 'undoped' PT/BF) that is described in copending U.S. patent application Ser. No. 742,334, filed June 7, 1985, entitled "Piezoelectric-Polymer Composites with 0-3 Connectivity for Transducer Applications". According to that disclosure, undoped PT/BF solid solution powders of any combination of the end members (lead titanate and bismuth ferrite) can be fabricated. The preferred compositions are those with 50-80% by weight of $BiFeO_3$, which compositions are in the vicinity of the tetragonal/rhombohedral phase boundary of the composition.

The desired PT/BF composition is formed from the binary oxides: $PbO$, $TiO_2$, $Bi_2O_3$, and $Fe_2O_3$. Appropriate weights of each oxide are mixed and ball milled for 12 hours and dried 8-12 hours in a low temperature furnace. This green mixture is milled in a spex for 10 minutes to break up agglomerations and further homogenize the batch and subjected to a low temperature (700°-800° C.) primary calcination for 1.5 hours, cooled, ground, sieved, and loosely compacted into pellets. The pellets are then subjected to a second high temperature firing (950°-1050° C.), from which they are quenched to room temperature either in air or by plunging into water. Quenching produces powders with average particle sizes of 5-10 micrometers depending on the specific composition.

PT/BF compositions exhibit a higher spontaneous strain on cooling below their Curie point (Tc). At temperatures above Tc PT/BF compositions exhibit cubic symmetry hence the 'a' and 'c' crystallographic are equal and spontaneous strain is minimal. On cooling below Tc PT/BF compositions adopt a tetragonal symmetry in which the 'a' and 'c' crystallograhic axes have sharply different values. Furthermore the c/a ratio is temperature dependant. The spontaneous strain in PT/BF compositions is among the highest for any piezoelectric material. This anisotropy in the crystallographic axes is the source of the high piezoelectric coefficients exhibited by these compositions.

The anisotropy and its temperature dependance are also the sources of strain within PT/BF crystallites. This limits the utility of these compositions in forming dense ceramic shapes but provides an excellent mechanism (i.e., thermal quenching) for forming fine powders of piezoelectric crystallites which can be dispersed and heavily loaded in polymers to form the composites of this invention.

Thermal quenching can be controlled to produce powders comprised of small diameter (1-10 m), equi-axed crystallites with narrow particle size distributions. The small polycrystalline aggregates that may form to some extent are readily dispersed as single crystallites during composite fabrication and poling.

Thermal quenching is preferred over conventional powder forming methods, as grinding, ball-milling, vibratory milling, etc., since composites made from powders prepared by conventional methods exhibit lower sensitivities to hydrostatic pressure. Extensive research directed at determining the origin of the lower sensitivity of conventionally prepared powders has led to the conclusion that structural defects are introduced in the microcrystals during the pulverizing process which leads to the formation of multidomained crystallites. It is a well known fact that it is more difficult to pole multidomained crystallites than single domained crystallites. That is, it is very difficult and, in some cases impossible, to completely develop a single polar axis oriented with an applied poling electric field in multidomained crystallites while this can be done in single domained crystallites. It is desired that the piezoelectric phase be an easily polable material since it will be used in polymer composites which are more difficult to pole than conventional dense piezoelectric ceramics. It is necessary that the piezoelectric phase be polable by electric field strengths that do not exceed the dielectric strength of the powder/polymer composite.

It is believed that thermal quenching produces a powder having crystallites with minimal defects. In aforementioned copending patent application Ser. No. 742,334, entitled "Piezoelectric-Polymer Composites with 0-3 Connectivity for Transducer Applications" a piezoelectric filler/polymer composite of 0-3 connectivity is described that employs a lead titanate-bismuth ferrite powder that is prepared by the thermal quenching technique to achieve higher hydrophone FOM's than achievable with prior art 0-3 composites.

SUMMARY OF THE INVENTION

In accordance with the present invention a 0-3 piezoelectric composite is provided that exhibits higher hydrophone sensitivity than prior art composites. The composite of the present invention results from the use of a piezoelectric filler phase comprising a lead titanate/bismuth ferrite (PT/BF) composition having part of the iron content replaced with manganese (referred to hereinafter as 'Mn-doped PT/BF'). Composites containing Mn-doped PT/BF exhibit Figures of Merit (FOM's) as hydrophone sensors that are two to three times higher than the highest FOM observed in the prior art composites containing undoped PT/BF.

Composites prepared with piezoelectric filler compositions of this invention exhibit higher longitudinal piezoelectric coefficients, $d_{33}$, and higher hydrophone Figures of Merit than composites made with prior art piezoelectric filler compositions including the simple lead titanate/bismuth ferrite compositions described in copending patent application Ser. No. 742,334, entitled "Piezoelectric-Polymer Composites with 0-3 Connectivity for Transducer Applications".

PREFERRED EMBODIMENTS

The preferred piezoelectric filler compositions of this invention have the formula:

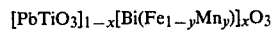

$$[PbTiO_3]_{1-x}[Bi(Fe_{1-y}Mn_y)]_xO_3$$

where $x=0.5-0.8$ and $y=0.005-0.10$.

The Mn-doped PT/BF compositions and 0-3 composites made from Mn-doped PT/BF powders of this invention can be fabricated in ways similar to the prior art processing of undoped PT/BF composition and composites. Mn-doped PT/BF solid solutions, like the prior art undoped PT/BF compositions, are solid solutions that exhibit considerable piezoelectric anisotropy especially at the tetragonal/rhombohedral phase boundary, a so-called morphotropic boundary. Composites with 0-3 connectivity incorporating the Mn-doped PT/BF filler of this invention are more sensitive than similar composites with undoped PT/BF composition of the prior art referred to above and far more sensitive than composites with other prior art fillers as lead titanate alone or lead zirconate titanate.

The crystallographic anisotropy of the Mn-doped PT/BF compositions of this invention limits the utility of these compositions in forming dense ceramic shapes but provides an excellent mechanism (i.e., thermal quenching) for forming fine powders of piezoelectric crystallites which can be dispersed and heavily loaded in polymers to form 0-3 composites. Thermal quenching can be controlled to produce powders with small diameter (in the range 1-10 m) equi-axed particles with narrow particle size distributions. Furthermore the particles are, for the most part, single crystallites. The small polycrystalline aggregates that may form to some extent are readily dispersed as single crystallites during composite fabrication and poling. It is believed that doping with small quantities of Mn (0.005-0.1 mol %) increases the resistivity of the (Pb,Bi)(Ti,Fe)$O_3$ ceramic powder. An increase in the resistivity of the ceramic will increase the breakdown strength of the composite.

Thermal quenching to form the piezoelectric ceramic particles is preferred over conventional powder forming methods, as grinding, ball milling, vibratory milling, etc., since composites made from powders prepared by conventional methods exhibit lower sensitivities to hydrostatic pressure. As stated previously, it is believed that thermal quenching produces a powder having crystallites with minimal defects.

The piezoelectric powder/polymer composites of this invention can be fabricated into a variety of shapes, including sheet and cable forms. In each shape the composite must lie between electroded surfaces. The electrodes are used during fabrication to apply the electric poling field and in use as a sensor to detect changes in polarization in the composite. Thin sheets of the composites of this invention can be fabricated from piezoelectric powders due to the fine particle size obtained by the thermal quenching technique. Sheets made with ceramic particles produced in this way are easily poled and have an enhanced piezoelectric sensitivity over piezoelectric composites having piezoelectric filler without any Mn.

Thermoplastic or thermosetting polymers can be used as matrix materials. Composites with thermoplastic polymers are preferred when the initially formed composite must be shaped or reshaped by thermal processing. Composites with thermosetting polymers are preferred when the final shape of the composite can be defined at the time the thermosetting polymer is cured. Specific polymers of each type are chosen for additional properties that are required; including for example, ability to wet the piezoelectric powder, dielectric breakdown strength, electric permittivity and loss, elastic compliance, thermal stability, glass transition temperature, heat distortion temperature, creep, composite strength and toughness, water resistance, resistance to property change with aging, etc.

Commercially available homopolymers, copolymers (alternating, random, and block), and blends are often useful. Suitable polymers include: Polystyrene, polysulfone, polycarbonate, polypropylene, polyethylene, polyethylene terephthalate, polyphenylene oxide, polyurethane elastomer, polyvinylcarbazole, polyvinylidene fluoride, polyacrylate esters, polyvinyl chloride, polyacrylonitrile, polymethacrylonitrile, polyvinylacetate, polyvinylpyrrolidone, cellulose-based polymers as ethyl cellulose, soluble polymers as polyimide, curable polymers as epoxy resins, cyanate resins, and unsaturated polyester resins, and elastomers including natural and synthetic rubber, fluororubber, and chloroprene. Blends and copolymers of the aforementioned polymers can be used.

0-3 piezoelectric powder/polymer composites are diphasic materials in which ceramic particles are not in contact with each other and the polymer phase is self-connected in all three dimensions. Powder loadings in the polymer matrix can range from 50-75 volume percent, preferably 60-75 volume percent, to achieve highest sensitivities as sensors.

0-3 composites of a piezoelectric powder phase and a thermoplastic polymer phase can be fabricated by dispersing the powder in the polymer in a blender at a temperature that softens the polymer phase. When necessary, the blending can be performed under vacuum to eliminate any air introduced during the mixing process. Brabender TM mixers are commercially available in a variety of sizes to blend powders with thermoplastic polymers. The product of blending in such a mixer will be irregularly shaped solid lumps unless steps are taken to shape it.

Composites with crosslinkable polymers can be fabricated by mixing the piezoelectric powder and polymer in its liquid or low viscosity uncured state. The mixture is then shaped (for example pressed into sheet form) and cured by heating or radiating to initiate a crosslinking mechanism. Epoxy resins are an important example of this type of polymer matrix material. Epoxy resins are available that have all the characteristics required of a matrix polymer and furthermore can be tailored to yield highly filled composites with a range of elastic compliances yielding composites that are flexible or stiff, as desired.

0-3 Composites can be fabricated into a variety of shapes. Large area sheet and long cable forms, for example, have effective hydrophone applications. A variety of methods for shaping 0-3 composites exist, including: hot rolling, compression or injection molding, die pressing, extrusion, and cable coating.

By hot rolling is meant that the ceramic-polymer mixture is rolled between two heated cylinders. The rolled sheet is then cured under pressure and applied according to the volume percent of filler material.

Molding a composite is achieved by placing the mixture in a mold on which a low pressure is applied. The composite is cured in the mold with the applied pressure maintained for the entire cure period.

By die pressing is meant that the composite material is set between two sheets of non-adhering material and placed in a suitably lined die. The material is then cured under a pressure applied according to the volume percent of ceramic.

In any shape the composite must lie between electroded surfaces. The electrodes are used (1) during fabrication, to apply the electric poling field and (2) in use as a sensor, to detect changes in polarization in the composite. Electrodes can be curable resin materials (e.g., epoxy resin) filled with a suspension of metallic (e.g., silver) conductive particles which can be painted on opposing surfaces of the piezoelectric composite shape. Alternatively, the electrode can be a thermoplastic composite of conductive particles (e.g., carbon) that can be laminated to opposing surfaces of the piezoelectric composite. Metallic electrodes can also be used. For example, a coaxial cable can be extruded having a center wire (copper) conductor, a piezo-composite core and a painted or laminated conductor-filled sheath. The center wire and the sheath can be used as electrodes on coaxial interior and exterior surfaces of the piezoelectric core.

Each piezoelectric particle in a 0-3 composite can have one or more polarization orientations. Before poling these polarization orientations are randomly directed. Application of stress to an unpoled piezo-composite produces changes in polarization in each particle but with no net effect because the polarization change is also randomly directed. Poling is a process whereby the polarization of all piezoelectric particles is oriented in a common direction. Poling can be accomplished by mechanical orientation of single domained particles, by shear stressing particles, or most commonly by applying an electric field to electrodes on opposing surfaces of the piezoelectric composite. In poled composites, stresses on the composite produce a net polarization change which can be detected as a flow of current in an external circuit that neutralizes the stress-induced polarization.

An improved poling process is described in copending patent application Ser. No. 742,333 filed June 7, 1985, entitled "Easily Poled 0-3 Piezoelectric Composites for Transducer Applications". The disclosure of which is incorporated by reference.

EXAMPLE

A piezoelectric powder composition [$0.5PbTiO_3$-$0.5Bi(Fe_{0.98}Mn_{0.02})O_3$] was formed by preparing batches from oxides; $PbO$, $BiO_2$, $Ti_2O_3$, $Fe_2O_3$ and $MnO_2$ and weighing the oxides in appropriate proportions allowing for the weight loss and purity characteristics of the starting materials. The weighed oxides were then mixed and ball milled with zirconia media for 12 hours and dried 8-12 hours in a low temperature furnace. Finally, the green mixture was milled in a spex mill for 10 minutes to break up agglomerates and further homogenize the batch. The green powders were subjected to a low temperature (700°-800° C.) primary calcination for 1.5 hours. The calcined powders were ground, sieved, and loosely compacted. The pellets were then subjected to a second higher temperature firing (950°-1050° C.) from which they were quenched. The pellets were water quenched from the second firing to room temperature. Soft agglomerates were broken by light grinding and the quenched powder sieved through a fine mesh. Quenching produced an average particle size of 1-10 m. The quenched filler material was mixed with the "Eccogel" polymer and the mixture placed in a vacuum for 0.5 hour to eliminate any air introduced during the mixing process. The loading of the piezoelectric ceramic phase was 60 volume %.

The capacitance and dissipation factor were measured at 1 kHz using a Hewlett-Packard 4270A Multi-Frequency LCR Meter. The $d_{33}$ coefficient was measured dynamically using a Berlincourt Piezo $d_{33}$-meter with the electromagnetic driver operating at a frequency of 100 Hz. Ten $d_{33}$ measurements were made on each sample using single-point probes, and the average was used as the $d_{33}$ coefficient of the composite.

The $g_h$ coefficient was determined using the dynamic A.C. technique at pressure of 100 PSI ~0.7 MPa and frequency of 50 Hz. An electromagnetic driver was used as an A.C. stress generator to apply pressure waves to the sample and a PZT standard, which were also under a static pressure from a hydraulic press. The charges produced from the sample and standard were buffered with an impedance convertor, and the voltages produced were measured on a Hewlett-Packard 3585A Spectrum Analyzer. The ratio of the voltages produced is proportional to the $g_h$ coefficient. By accounting for the sample geometries and the stray capacitance of the holders, the $g_h$ coefficient of the sample was calculated.

The polarization apparatus employed consisted of a spring-loaded sample holder suspended in an agitated hot silicone oil bath and dc voltage generator. The optimum polarization temperature field and time are listed in Table 1. It was observed that at temperatures below 70° C. significant polarization is rarely realized and only with application of excessively high fields which cannot be maintained for an appreciable period, while ahove 80° C. the incidence of breakdown becomes increasingly more frequent even with the application of a modest poling field. The optimum poling temperature of 75° C. was thereby established and applied for the polarization of samples investigated.

Optimum polarization fields and times were similarly determined by systematically varying the parameters and monitoring the degree of polarization and the incidence of breakdown. The results of this study are presented in Table 1.

The optimum poling fields of 100 KV/cm for Mn doped PT-BF composites and 110 KV/cm for undoped PT-BF composites were thereby established for the polarization of the composites.

Mn-doping of the filler significantly enhances the polarization and ultimate piezoelectric properties of the composite materials. Samples doped with 0.02 mole % Mn exhibit outstanding hydrostatic sensitivity attaining values of $g_h$ and $d_h$ well in excess of the values reported for undoped PT-BF as a 0-3 composite filler. Composites containing 60 volume percent [0.5PbTiO$_3$-0.5Bi(Fe$_{0.98}$Mn$_{0.02}$)O$_3$] exhibit a $d_h$ of 35 pCN$^{-1}$, $g_h$ of $100 \times 10^{-3}$ VMN$^{-1}$ and $d_h g_h$ of $3500 \times 10^{-15}$ m$^2$N$^{-1}$ which is about two times higher than those of composites containing undoped PT-BF (similar loading), Table 2.

TABLE 1

Poling conditions of undoped PT-BF and Mn-doped PT-BF composites

| Composite | Applied Voltage (KV/cm) | Time (min) | Temperature °C. |
|---|---|---|---|
| undoped PT-BF | 110 | 30 | 75 |
| Mn doped PT-BF | 100 | 15 | 75 |

TABLE 2

Dielectric and piezoelectric properties of undoped and Mn doped PT-BF composites.

| Composite | $K_{33}$ | pCN$^{-1}$ | $10^{-3}$ V mN$^{-1}$ | pCN$^{-1}$ | $\times 10^{-15}$ m$^2$/N |
|---|---|---|---|---|---|
| 0.5PbTiO$_3$—0.5BiFeO$_3$ [60 Vol % powder and 40 Vol % Eccogel Polymer] | 40 | 45 | 65 | 25 | 1625 |
| 0.5PbTiO$_3$—0.5Bi(Fe$_{0.98}$Mn$_{0.02}$)O$^3$ [60 Vol % Powder and 40 Vol % Eccogel Polymer] | 40 | 55 | 100 | 35 | 3500 |

What is claimed is:

1. A piezoelectric ceramic comprising a PbTiO$_3$-BiFeO$_3$ solid solution having 0.5 to 10 mol. % of the iron content replaced with manganese.

2. The piezoelectric ceramic of claim 1 having the following formula:

[PbTiO$_3$]$_{1-x}$[Bi(Fe$_{1-y}$Mn$_y$)O$_3$]$_x$;

wherein $x=0.5-0.8$ and $y=0.005-0.10$.

3. The piezoelectric ceramic of claim 2 in powdered form having an average particle size of about 5 microns.

4. A piezoelectric-polymer composite material of 0-3 connectivity which comprises: a matrix of insulating polymer and a piezoelectric ceramic powder disbursed within said polymer matrix, said ceramic powder comprising a PbTiO$_3$-BiFeO$_3$ solid solution wherein 0.5 to 10 mol. % of the iron content is replaced with manganese.

5. The composite of claim 4 wherein said solid solution has the following formula:

[PbTiO$_3$]$_{1-x}$[Bi(Fe$_{1-y}$Mn$_y$)O$_3$]$_x$;

wherein $x=0.5-0.8$ and $y=0.005-0.10$.

6. The composite of claim 4 wherein said ceramic powder comprises 50–75 volume % of said piezoelectric polymer composite.

7. The composite of claim 6 wherein said ceramic powder comprises 60–75 volume % of said piezoelectric polymer composite.

8. The composite of claim 4 wherein said ceramic powder has an avaerage particle size of about 5 microns.

9. The composite of claim 4 wherein said ceramic powder has been formed by quenching a solid solution of heated $PbTiO_3$ and $BiFeO_3$ containing said manganese.

10. The composite of claim 4 wherein said insulating polymer matrix is a thermoplastic resin.

11. The composite of claim 4 wherein said insulating polymer matrix is a thermosetting resin.

12. The composite of claim 4 wherein said insulating polymer matrix is an epoxy resin.

* * * * *